(12) United States Patent
Khechana et al.

(10) Patent No.: US 9,323,047 B2
(45) Date of Patent: Apr. 26, 2016

(54) METHOD OF MANUFACTURING A MEMS MICRO-MIRROR ASSEMBLY

(71) Applicant: Intel Corporation, Santa Clara, CA (US)

(72) Inventors: Faouzi Khechana, Preverenges (CH); Nicolas Abele, Demoret (CH)

(73) Assignee: INTEL CORPORATION, Santa Clara, CA (US)

( * ) Notice: Subject to any disclaimer, the term of this patent is extended or adjusted under 35 U.S.C. 154(b) by 0 days.

(21) Appl. No.: 14/382,734

(22) PCT Filed: Feb. 21, 2013

(86) PCT No.: PCT/EP2013/053483
§ 371 (c)(1),
(2) Date: Sep. 3, 2014

(87) PCT Pub. No.: WO2013/131759
PCT Pub. Date: Sep. 12, 2013

(65) Prior Publication Data
US 2015/0022872 A1    Jan. 22, 2015

Related U.S. Application Data

(60) Provisional application No. 61/608,434, filed on Mar. 8, 2012.

(51) Int. Cl.
*G02B 26/08* (2006.01)
*B81C 3/00* (2006.01)
(Continued)

(52) U.S. Cl.
CPC .......... *G02B 26/085* (2013.01); *B81C 1/00214* (2013.01); *B81C 1/00873* (2013.01); *B81C 3/005* (2013.01); *G02B 7/1821* (2013.01); *G02B 26/0833* (2013.01); *G02B 26/105* (2013.01); *H05K 1/189* (2013.01); *H05K 3/328* (2013.01); *B81B 2201/042* (2013.01); *B81B 2207/098* (2013.01); *B81C 2203/054* (2013.01); *B81C 2203/057* (2013.01); *H01L 2224/48091* (2013.01); *H01L 2924/1461* (2013.01); *H05K 1/118* (2013.01); *H05K 2201/083* (2013.01); *H05K 2201/10083* (2013.01); *H05K 2203/049* (2013.01); *Y10T 29/4913* (2015.01)

(58) Field of Classification Search
CPC .. G02B 26/085; G02B 7/1821; G02B 26/105; G02B 26/0833; B81C 3/005; B81C 1/00301; B81C 2203/0118; B81B 2201/042
USPC ................ 359/201.2, 223.1–226.1, 290, 291; 430/300, 319
See application file for complete search history.

(56) References Cited

U.S. PATENT DOCUMENTS 6,989,921 B2    1/2006  Bernstein et al.
7,230,743 B2 *  6/2007  Matsuo ................ G02B 26/085
                                                              359/200.7

(Continued)

FOREIGN PATENT DOCUMENTS

EP        1215168 A1    6/2002

*Primary Examiner* — Euncha Cherry
(74) *Attorney, Agent, or Firm* — Kacvinsky Daisak Bluni PLLC

(57) ABSTRACT

According to the present invention there is provided a method of manufacturing a MEMS micro mirror assembly (250), comprising the step of mounting a PCB board (205) on a metallic plate (206), mounting a MEMS device (240) on the PCB board (205), wherein the MEMS device (240) comprises a MEMS die (241) and a magnet (230).

13 Claims, 7 Drawing Sheets

(51) Int. Cl.
*H05K 1/18* (2006.01)
*H05K 3/32* (2006.01)
*B81C 1/00* (2006.01)
*G02B 7/182* (2006.01)
*G02B 26/10* (2006.01)
*H05K 1/11* (2006.01)

(56) References Cited

U.S. PATENT DOCUMENTS

2005/0099671 A1    5/2005   Matsuo et al.
2006/0181762 A1    8/2006   Nam et al.

\* cited by examiner

METHOD OF MANUFACTURING A MEMS MICRO-MIRROR ASSEMBLY

FIELD OF THE INVENTION

The present invention concerns method of manufacturing a MEMS micro mirror assembly; and in particular, but not exclusively, to a method of manufacturing and a MEMS micro mirror assembly which comprises the step of mounting a MEMS micro mirror device on a PCB board.

DESCRIPTION OF RELATED ART

A MEMS micro-mirror device is a device that contains an optical MEMS (Micro-Electrical-Mechanical-System). The optical MEMS micro-mirror device may comprise an elliptical, cylindrical, rectangular, square or random shape micromirror that is adapted to move and to deflect light over time. The micro-mirror is connected by torsional arms to a fixed part and can tilt and oscillate along one or two axis. For example it can oscillate vertically and horizontally. Different actuation principles can be used, including electrostatic, thermal, electro-magnetic or piezo-electric. MEMS micro-mirror devices are known in which the area of these micro-mirrors are around a few $mm^2$. In this case, the dimensions of the MEMS micro-mirror device, comprising the packaging, is around ten $mm^2$. This MEMS micro-mirror device is usually made of silicon, and can be encapsulated in a package that can include the driving actuation electronics. Various optical components, such as for example lenses, beam combiner, quarter-wave plates, beam splitter and laser chips, are assembled with the packaged MEMS to build a complete system.

A typical application of the MEMS micro-mirror devices is for optical scanning and projection systems. In a projection system, a 2-D or 3-D image or video can be displayed on any type of projection surface. In a colour system, each pixel of the image is generated by combining modulated red, green and blue laser light, by means of, for example, a beam combiner, to generate a combined light beam which defines a pixel of the image or video. The MEMS micro-mirror in the MEMS micro-mirror device directs the combined light beam to a projection surface where the pixel of the image or video is displayed. Successive pixels of the image or video are display in this manner. By means of its oscillations, the MEMS micro-mirror within the MEMS micro-mirror device will continuously scan the combined light beam from left to right and and from top to bottom (or according to a different trajectory including e.g. Lissajou trajectories) so that all the pixels of the image, or video, are displayed on the projection surface, successively, pixel-by-pixel. The MEMS micro-mirror will oscillate about its oscillation axes at a frequency which ensures that the combined light beam is scanned across the projection surface at such a speed that a complete image is visible to a person viewing.

Typically, the MEMS micro-mirror in a MEMS micro-mirror device is able to oscillate along a single oscillation axis. Therefore, in order to display a 2-D image on a screen a projection system will require two MEMS micro-mirror devices; a first MEMS micro-mirror device which is required to scan the combined light beam along the horizontal and a second MEMS micro-mirror device which is required to scan the combined light beam along the vertical. Alternatively the MEMS micro-mirror in a MEMS micro-mirror device could be configured such that it can be oscillated about two orthogonal oscillation axes.

Referring now to FIGS. 6a and 6b which show a known MEMS micro-mirror device 1; FIG. 6a provides a plan view of the MEMS micro-mirror device 1 and FIG. 6b shows a cross sectional view of the MEMS micro-mirror device 1, taken along A-A' of FIG. 6a.

The MEMS micro-mirror device 1 comprises a first support frame 2. A first torsional arm 3a and second torsional arm 3b connect a moveable part 4 to the support frame 2. The moveably part comprises a micro mirror 8 mounted thereon. In this embodiment the support frame 2 is fixed (i.e. immovable). The first and second torsional arms 3a,b define a first oscillation axis 7 for the moveable part 4. A first actuation coil 5 is supported on, and connected to, the moveable part 4. The first actuation coil 5 is arranged to extend, from a first electrical contact 9a which is located on the support frame 2, along the first torsional arm 3a, around the perimeter of the moveable part 4 and back along the first torsional arm 3a to a second electrical contact 9b which is located on the support frame 2.

The first support frame 2, first and second torsional arms 3a,b, the moveable part 4, the micro mirror 8, and first actuation coil 5, define collectively a MEMS die 10. As shown in FIG. 6b the MEMS die 10 is mounted on, and fixed to (using glue for example), a magnet 6 such the first actuation coil 5 is submerged in the magnetic field 'B' generated by the magnet 6. Preferably the MEMS die 10 is fixed at the first support frame 2 to the magnet 6; this is usually achieved by providing glue between the first support frame 2 of the MEMS die 10 and the magnet 6.

During use an electric current 'I' is passed through the first actuation coil 5. As the first actuation coil 5 is submerged in the magnetic field 'B' created by the magnet 6, the actuation coil 5 will provide a Laplace force which will be applied to the moveable part 4. The Laplace force will cause the moveable part 4, and thus the micro mirror 8, to oscillate about its first oscillation axis 7.

It should be understood that the MEMS micro-mirror device 1 could alternatively be configured to enable oscillation of the moveable part 4 about two orthogonal axes, so that the micro mirror 8 can scan light in two dimensions (typically along the horizontal and vertical). FIG. 7 shows a MEMS micro-mirror device 100 which is configured to enable oscillation of the moveable part 4 about two orthogonal axes.

The MEMS micro-mirror device 20 has many of the same features of the MEMS micro-mirror device 1 shown in FIGS. 6a and 6b; however in the MEMS micro-mirror device 20 the support frame 2 is configured to be moveable; the support frame 2 is configured such that it can oscillate about a second oscillation axis 17, which is orthogonal to the first oscillation axis 7.

The MEMS micro-mirror device 20 further comprises a fixed part 12 (i.e. an immovable part); the support frame 2 is connected to the fixed part 12 via third and fourth torsional arms 13a,b. The third and fourth torsional arms 13a,b, define the second oscillation axis 17. A second actuation coil 15 is connected to the support frame 2. This second actuation coil 15 will also be submerged by the magnetic field 'B' generated by the magnet 6.

A second actuation coil 15 is supported on, and connected to, the support frame 2. The second actuation coil 15 is arranged to extend, from a first electrical contact 19a which is located on the fixed part 12, along the third torsional arm 13a, around the perimeter of the support frame 2 and back along the third torsional arm 13a to a second electrical contact 19b which is located on the fixed part 12. It should be noted that the second actuation coil 15 does not extend along the fourth torsional arm 13b.

Furthermore, in the MEMS micro-mirror device 20 the first and second electrical contacts 9a,9b for the first actuation coil 5 are located on the fixed part 12 and thus the first actuation coil 5 is arranged to also extend along the support frame 2 and the third and fourth torsional arms in order to electrically connect to the first and second electrical contacts 9a,9b.

The first support frame 2, first and second torsional arms 3a,b, the moveable part 4, the micro mirror 8, and first actuation coil 5, the fixed part 12, second actuation coil 15, third and fourth torsional arms 13a,b, define collectively a MEMS die 90. The MEMS die 90 is mounted on, and fixed to (using glue for example), a magnet 6 such the first actuation coil 5 is submerged in the magnetic field 'B' generated by the magnet 6. Preferably the MEMS die 90 is secured at the fixed part 12 to the magnet 6; this is usually achieved by providing glue between the fixed part 12 of the MEMS die 90 and the magnet 6.

During use an electric current 'i' is passed through the first actuation coil 5 which is connected to the moveable part 4. As the first actuation coil 5 is submerged in the magnetic field 'B' created by the magnet 6 the first actuation coil 5 will provide a Laplace force which will be applied to the moveable part 4. The Laplace force will cause the moveable part 4, and thus the micro mirror 8, to oscillate about the first oscillation axis 7. An electric current 'I' is also passed through the second actuation coil 15 which is connected to the support frame 2. As the second actuation coil 15 is also submerged in the magnetic field 'B' created by the magnet 6, the second actuation coil 15 will provide a Laplace force which will be applied to the support frame 2. The Laplace force which is applied to the support frame 2 by the second actuation coil 15 will cause the support frame 2, and thus the moveable part 4 which is connected to the support frame 2 via the torsional arms 13a,b, to oscillate about the second oscillation axis 17. Accordingly the micro mirror 8 will be oscillated about the first and second orthogonal oscillation axes 7,17. If the micro mirror 8 reflects light as it is oscillating about the first and second orthogonal oscillation axes 7,17 the reflected light will be scanned in two dimensions e.g. horizontal and vertical. This will, for example, enable combined light beams which the micro mirror 8 receives, to be scanned across the area of a projection screen in, for example, a zig-zag pattern.

One of the typical drawbacks of current assembly of the MEMS die 10,90 and magnet 6 are the combination of mechanical stability, electrical conductivity and mechanical integration into sub-system components. Current solutions do not provide an optimum combination on these parameters.

MEMS micro-mirror devices such as devices 1,20 shown in FIGS. 6a,b and 7 have small dimensions are difficult to handle. The difficulty in handling typically becomes a problem when the MEMS micro-mirror devices are to be incorporated onto a PCB board; accurate positioning of the MEMS micro-mirror devices on the PCB board is difficult to achieve as the MEMS micro-mirror devices are very easily displaced. Furthermore, MEMS micro-mirror devices may fall or may become lost while being handled. This is particularly true in cases where the MEMS micro-mirror devices are being integrated manually onto a PCB board.

It is an aim of the present invention to obviate or mitigate at least some of the above-mentioned disadvantages.

BRIEF SUMMARY OF THE INVENTION

According to the present invention there is provided a method of manufacturing a MEMS micro mirror assembly, comprising the steps of, mounting a PCB board on a metallic plate, mounting a MEMS device on the PCB board, wherein the MEMS device comprises a MEMS die and a magnet.

The metal plate may comprise ferromagnetic material. The metal plate may be a ferromagnetic plate.

Advantageously, the MEMS device is held in position on the PCB board by the magnetic attraction between the magnet of the MEMS device and the metallic plate. Preferably the thickness of the PCB board is such that a magnetic field generated by the magnet of the MEMS device submerges at least part of the metallic plate, to provide a magnetic attraction between the magnet of the MEMS device and the metallic plate. Another advantage of the solution is that parallel assembly of a plurality of MEMS micro mirror assemblies can be easily executed, which is otherwise very difficult as the magnets from each of the MEMS micro mirror assemblies would tend to attract or repel each other thereby becoming displaced.

Preferably the PCB board is a flexible PCB board. The PCB board may be a PCB foil.

The PCB board may further comprise one or more pads which are used to electrically connect the MEMS device to the PCB board. The PCB board may further comprise one or more electrical pads which are used to electrically connect the MEMS micro mirror assembly to electrical contacts of another electrical component. The one or more pads which are used to electrically connect the MEMS micro mirror assembly to electrical contacts of another electrical component, may be arranged to mechanically directly contact the electrical contacts of another electrical component.

The step of mounting the MEMS device on the PCB board, may comprise the steps of first mounting the magnet of the MEMS device on the PCB board and then mounting the MEMS die on the magnet.

The MEMS die may have any of the features of the known MEMS die of the MEMS devices shown in FIGS. 6a,b and 7. Preferably the moveable part comprises a micro mirror. The movable part may be configured to oscillate about a single oscillation axis or to oscillate about two orthogonal oscillation axes. The movable part may further comprise an actuation coil. The actuation coil may be attached to the movable part or may be embedded in the moveable part.

Preferably the step of mounting the MEMS die on the magnet comprises fixing the MEMS die to the magnet. The step of fixing the MEMS die to the magnet may comprise gluing the MEMS die to the magnet.

The step of mounting the MEMS device on the PCB board may comprise fixing the MEMS device to the PCB board. The step of fixing the MEMS device to the PCB board may comprise gluing the MEMS device to the PCB board.

The method may further comprise the step of aligning the magnet of the MEMS device with alignment marking which is provided on the PCB board.

The method may comprise the step of mounting a plurality of MEMS devices on the PCB board.

The method may further comprise the step of dividing the PCB board to provide a plurality of mechanically independent MEMS assemblies, each MEMS assembly comprising a single MEMS device mounted on a PCB board. For example, the PCB board could be divided by cutting the PCB board. The dividing or segmenting of the PCB board may be achieved by dicing, tearing the PCB board manually or cutting the PCB board with a knife. The PCB board may further comprise lines of mechanical weakness. These lines of mechanical weakness may be defined by pre cut portions of the PCB board. This will facilitate the dividing or segmenting of the PCB board to provide a plurality of mechanically independent MEMS micro mirror assemblies.

The method may further comprise the steps of, mounting an alignment mask on the PCB board, wherein the alignment mask comprises a grid, and using the grid of the alignment mask to position one or more MEMS devices on the PCB board when mounting the one or more MEMS devices on the PCB board.

The grid may be configured to define a plurality of rectangular apertures each aperture suitable for receiving a MEMS device. Each rectangular aperture may further comprise a cut-out which is located at at least one corner of the rectangular aperture. The cut out may be a circular cut out. The grid may comprise chamfered sides such that the cross sectional area of a rectangular aperture at a first side of the alignment mask is larger than the cross sectional area of the rectangular aperture at a second, opposite, side of the alignment mask. The sides of the grid which define each of the rectangular apertures may be chamfered.

The method may further comprise the step of securing the alignment mask to the PCB board. The method may further comprise the step of removing the alignment mask from the PCB board, after the or each MEMS device has been mounted on the PCB board.

The step of using the grid of the alignment mask to position the plurality of MEMS devices on the PCB board may comprise, positioning a single MEMS device in one or more apertures defined in the grid, and arranging each MEMS device so that at least a first and second side of each MEMS device contacts the grid.

The method may comprise the step of positioning a MEMS device such that a first and second side of a MEMS device abuts the grid of the alignment mask and an edge of the MEMS device, which is located at an interface between the first and second sides, is located in a cut-out which is provided in the grid, so that the edge of the MEMS device remains remote from the grid when the first and second sides of the MEMS device abut the grid. The cut-out may be located at a corner of the rectangular aperture.

The first and second sides of the MEMS device may be first and second sides of the magnet of the MEMS device.

The method may comprise the step of adjusting the size of the
PCB board so that sides of the PCB board are aligned with sides of the alignments mask when the alignment mask is mounted on the PCB board. The method may comprise the step of adjusting the size of the PCB board so that the length and width of the PCB board is equal to the length and width of the alignment mask. The PCB board may be dimensioned such that four sides of the PCB board are aligned with four sides of the MEMS device; this will provide for a compact assembly.

The method may comprise the step of adjusting the size of the PCB board so that only two sides of the MEMS device are aligned with three sides of the PCB board, when the MEMS device is mounted on the PCB board.

The method may comprise the step of adjusting the size of the PCB board so that only three sides of the MEMS device are aligned with three sides of the PCB board, when the MEMS device is mounted on the PCB board.

The method may comprise the step of adjusting the size of the PCB board so that when the MEMS device is mounted on the PCB board a first extension portion is provided which is defined by a part of the PCB which extends from beneath the MEMS device. The method may comprise the step of adjusting the size of the PCB board so that when the MEMS device is mounted on the PCB board a first and second extension portion is provided which are defined by parts of the PCB which extend in opposite directions from beneath the MEMS device.

The method may further comprise the step of electrically connecting the MEMS device to the PCB board. The step of electrically connecting the MEMS device to the PCB board may comprise arranging the PCB board such that electrical pads on the PCB board directly contact electrical pads on the MEMS device. The step of electrically connecting the MEMS device to the PCB board may comprise arranging one or more wire bonds to electrically connect one or more electrical pads on the PCB board to one or more electrical pads on the MEMS device.

Preferably the step of electrically connecting the MEMS device to the PCB board may comprise arranging two or more wire bonds to electrically connect an electrical pad on the PCB board to an electrical pad on the MEMS device.

The method may further comprise the step of arranging a protective material to form an enclosure which encloses the one or more wire bonds. Using multiple wire bonds will advantageously increase the reliability of the connection as if one wire bond breaks the other wire bonds will maintain the electrical connection.

The PCB board may further comprise electrical pads.

The MEMS device may further comprise electrical pads.

The wire bonds may comprise Anisotrope Conductive Film (ACF). The Anisotrope Conductive Film may be mechanically and electrically attached to electrical pads provided on the MEMS die by applying pressure and/or heat to the ACF. The Anisotrope Conductive Film may be mechanically and electrically attached to electrical pads provided on the PCB board by applying pressure and/or heat to the ACF. The ACF may comprise a metal part which is connected to said electrical pads.

The method may comprise the step providing conductive glue between an electrical pad and wire bond to electrically connect the wire bond to the electrical pad. The conductive glue may comprises be protected by a glop-top, thick glue, epoxy or resist.

The method may comprise the step of using a glue to fix the MEMS die on the magnet. The method may comprise the step of using a glue to fix the MEMS device on the PCB board. The method may comprise the step of using a glue to fix the PCB board on the metallic plate. The glue may comprise epoxy glue, silicon glue, cyano-acrylate. These glues can be cured for improving the adhesion.

The method may further comprise the step of mounting one or more electronic components, on the PCB board. The one or more electronic components may comprise at least one of connectors, photodiode, active or passive electronics.

The flexible PCB may have alignment marks to help on the assembly. Alignment marks can either be made using same metallic section present in the flexible PCB, or by screen printing, by a photolithography process or laser writing. The method may comprise the step of aligning the alignment mask with the alignment marks. The method may comprise the step of aligning the MEMS device with the alignment marks.

The flexible PCB may have locally, mechanically, re-enforced areas in order to provide higher mechanical stability. For example the flexible may be locally re-enforced in the regions of the wire bonds, so as to prevent mechanical stresses on the PCB from detaching the wire bonds from electrical pads. The mechanically, re-enforced areas may be areas of increased thickness. The method may comprises the step of providing electrically conductive lines parallel to, and adjacent to, the mechanically, re-enforced areas of the PCB board.

The method may comprises the step of arranging the electrically conductive lines to electrically connect the one or more pads which are used to electrically connect the MEMS device to the PCB board, to the one or more electrical pads which are used to electrically connect the MEMS micro mirror assembly to electrical contacts of another electrical component.

The PCB board may further comprise alignment marks to facilitate the alignment of the MEMS device on the PCB board. The method may comprise the step of aligning the MEMS device with the alignment marks on the PCB board.

The alignment mask may further comprise alignment marking to facilitate the alignment of the MEMS die with the magnet. The method may comprise the step of aligning the MEMS die with alignment marking provided on the alignment mask. The method may comprise the step of providing alignment marks on the alignment mask by using same metallic section present in the flexible PCB, or by screen printing, by a photolithography process or laser writing.

All the alignment, positioning and attaching steps can be made manually, semi-automatically or automatically, using pick-and-place equipment for example.

According to the present invention there is provided a method of manufacturing an optical system, comprising the steps of manufacturing a MEMS micro mirror assembly according to any of the above-mentioned method steps, and integrating the MEMS micro mirror assembly into an optical device which comprises one or more laser diodes, arranging the MEMS micro mirror assembly such that it receives light from at least one of the laser diodes.

BRIEF DESCRIPTION OF THE DRAWINGS

The invention will be better understood with the aid of the description of an embodiment given by way of example only and illustrated by the figures, in which:

FIG. 6b provides a cross sectional view of the MEMS micro-mirror device shown in FIG. 6a, taken along line A-A' of FIG. 6a;

DETAILED DESCRIPTION OF THE DRAWINGS

Figure 1A:
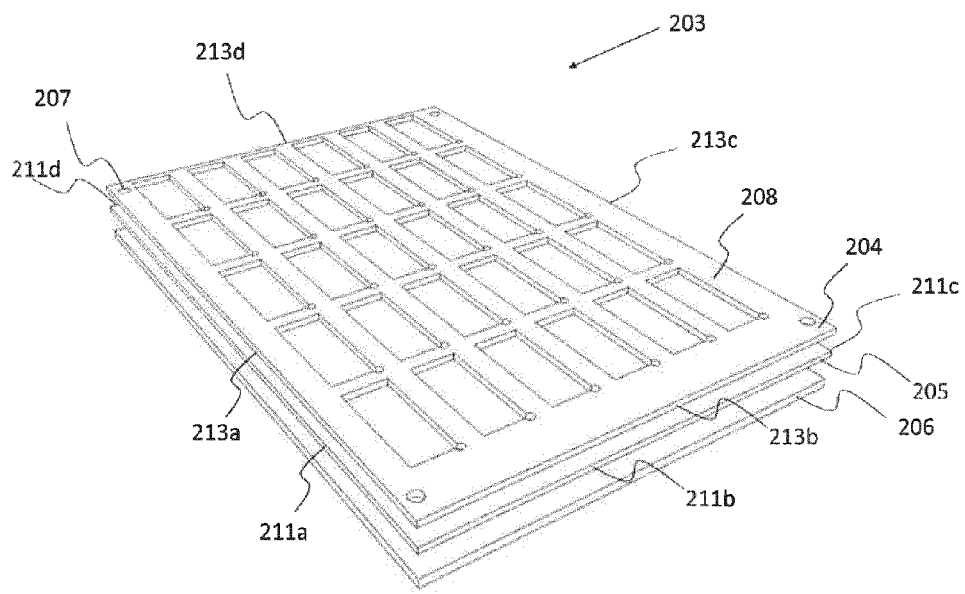
FIGS. 1a and 1b, illustrate a step in an exemplary method of manufacturing a MEMS micro mirror assembly, according to the present invention.
Figure 1B:
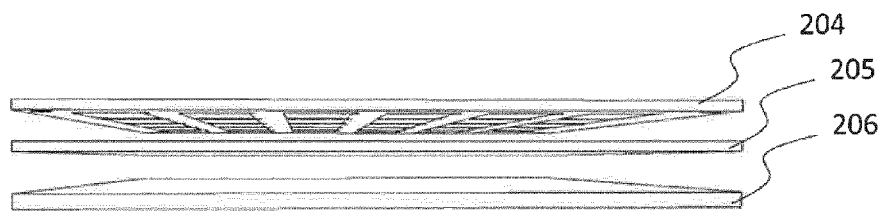

FIGS. 1a and 1b, illustrate a step in an exemplary method of manufacturing a MEMS micro mirror assembly, according to the present invention. The step involves mounting a PCB board 205 on a metallic plate 206.

The PCB board 205 may be a flexible. Preferably the PCB board 205 is segmented to enable the PCB board 205 to be easily divided; to divide the PCB board 205 the segments of the PCB board 205 are simply separated from one another to provide a plurality of mechanically independent, smaller sized, PCB boards. Each segment may be defined by grooves which a provided on the PCB board 205; at the grooves the PCB board 205 will have reduced thickness thus facilitating the separation of the segments from one another. It will be understood that the segments could be defined in any other suitable manner; for example the PCB board 205 may be partially cut to provide lines of mechanical weaknesses in the PCB board 205, the individual segments may be defined by these line of mechanical weaknesses.

Once the PCB board 205 has been mounted on the metallic plate 206, an alignment mask 204 is then mounted on the PCB board 205. The alignment mask 204 may be secured to the PCB board 205 by providing screws or fasteners in screw holes 207 which are provided on an outer-frame 208 of the alignment mask 204.

If the PCB board 205 is larger than the alignment mask 204, then the method may comprise the step of adjusting the size of the PCB board 205 so that sides 211a,b,c,d of the PCB board 204 can be aligned with sides 213,a,b,c,d of the alignments mask 204, when the alignment mask 204 is mounted on the PCB board 205. The size of the PCB board 205 may be easily adjusted by simply removing segments of the PCB board 205; an appropriate number of segments are removed until the length and width of the PCB board 205 is equal to the length and width of the alignment mask 204.

Figure 2:
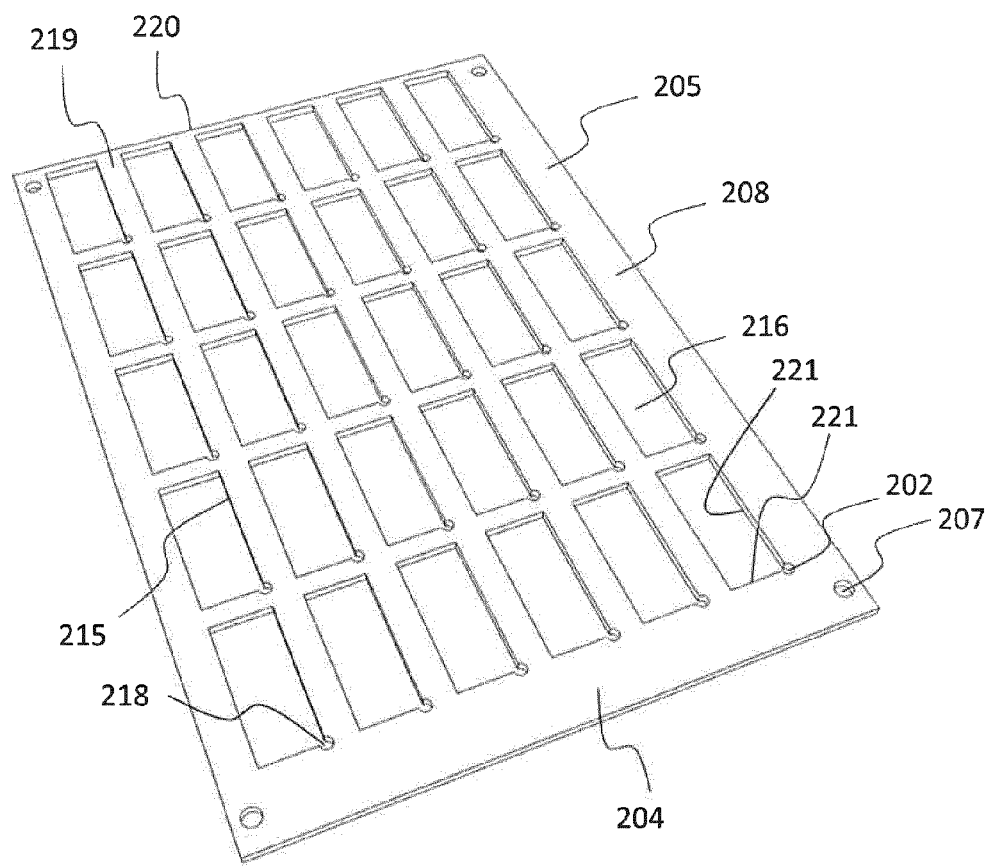
FIG. 2 provides a perspective view of the alignment masks used in step illustrated in FIGS. 1a and 1b.

FIG. 2 provides a perspective view of the alignment mask 204. The alignment mask comprises a grid 215. The grid 215 defines a plurality of rectangular apertures 216, each aperture suitable for receiving a MEMS device. A circular cut-out 218 is provided at one of the corners of each of rectangular apertures 216.

Side portions 221 of the grid 215 which define each of the rectangular apertures 216 are chamfered, such that the cross sectional area of a rectangular aperture 216 at a first side 219 of the alignment mask 204 is smaller than the cross sectional area of the rectangular aperture 216 at a second, opposite, side 220 of the alignment mask 204.

Figure 3:
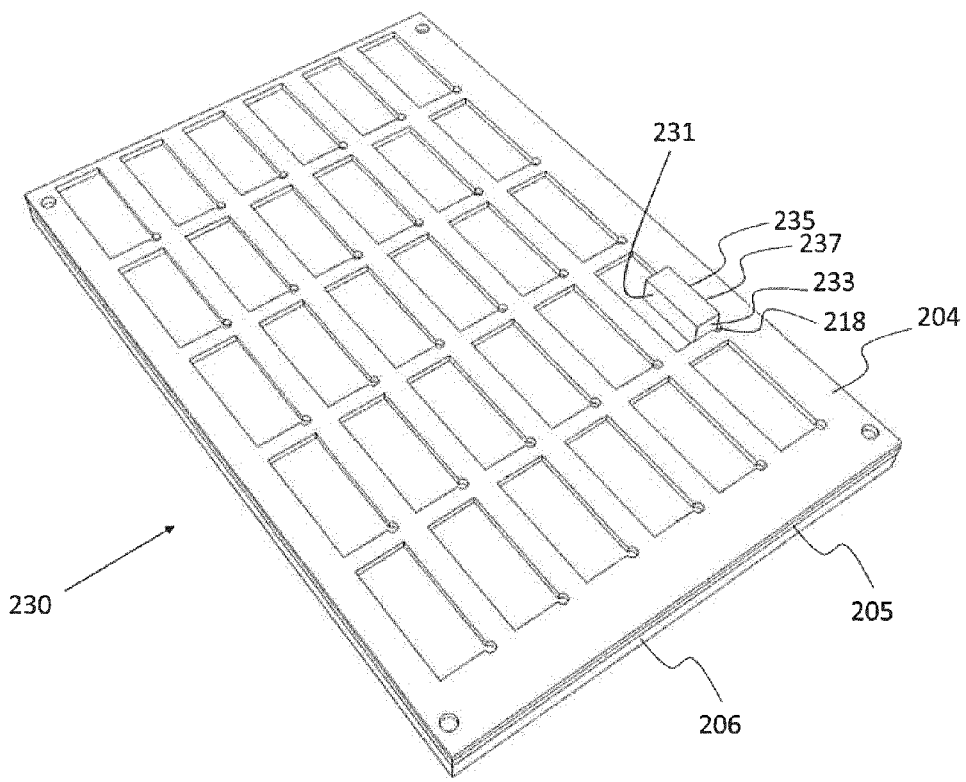
FIG. 3 illustrates a further step in an exemplary method of manufacturing a MEMS micro mirror assembly, according to the present invention.
Figure 4:
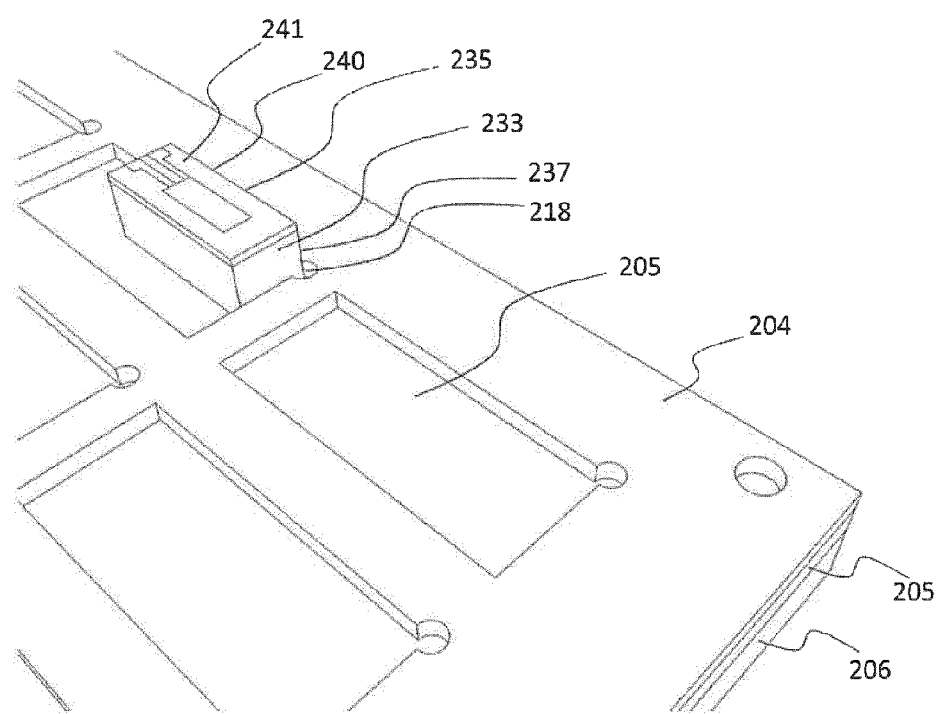
FIG. 4 illustrates a further step in an exemplary method of manufacturing a MEMS micro mirror assembly, according to the present invention.

Referring now to FIGS. 3 and 4 there is illustrated further steps in the exemplary method.

When the PCB board 205, metallic plate 206 and alignment mask 204 are mounted on one another, they form a stack 230. A MEMS device 240 is then mounted on the PCB board 205. In this example the MEMS device 240 comprises a MEMS die 241 and a magnet 231. It will be understood that the magnet 231 may be a single permanent magnet or a collection of magnets which are connected to from a single magnetic component. The MEMS die 241 may comprises any of the features of the known MEMS die 1, 20 discussed in the introduction.

In this example the MEMS device 240 is mounted piecewise on the PCB board 205; first the magnet 231 is mounted on the PCB board 205 and then the MEMS die 241 is mounted on the magnet 231. FIG. 3 illustrates the step of mounting the magnet 231 on the PCB board 205. FIG. 4 illustrates the step of mounting the MEMS die 241 on the magnet 231.

It will be understood that alternatively the MEMS die 241 could be first mounted on the magnet 231 to form the MEMS device 240 and the MEMS device 240 would then mounted on the PCB board 205.

As shown in FIG. 3 the grid 215 of the alignment mask 204 is used to position the magnet 231 (and thus the MEMS device 240) on the PCB board 205. The magnet 231 is positioned in one of the apertures 216 of the grid 215. The magnet 231 is arranged so that a first side 233 and second side 235 of the magnet 231 abut the grid 215 of the alignment mask 204 and an edge 237 of the magnet 231, which is located at an interface between the first and second sides 233,235, is located in a cut-out 218 so that the edge 237 of the magnet 231 remains remote from the grid 215 when the first and second sides 233,235 of the magnet 231 abut the grid 215. The circular cut-out 218 enables precise positioning of the magnet 231 as the magnet does not then abut round corner but only linear perpendicular sides 233,235; the positioning of the magnet is achieved using the first and second sides 233,235 of the magnet, rather than using one single corner 237 of the magnet 231.

The magnet 231 may be secured to the PCB board 205 using glue. Thus before mounting the magnet 231 on the PCB board 205 a layer of glue may be applied to the portion of the PCB board on which the magnet 231 will be mounted or may be applied to an under-surface of the magnet 231. The glue will fix the magnet 231 to the PCB board 204.

The chamfered side portions 221 of the grid 215 will ensure that glue, which squeezed out from under the magnet 231 when the magnet 231 is mounted on the PCB board 204, does not contact the alignment mask 204.

Once the magnet 231 has been mounted on the PCB board 204 the MEMS die 241 is then mounted on the magnet 231, as shown in FIG. 4. The MEMS die 241 is fixed to the magnet 231 using any suitable fixing means; in this example the MEMS die 241 is fixed to the magnet 231 using glue.

The magnetic field which is generated by the magnet 231 of the MEMS device 240 will pass through the PCB board 205 to the metallic plate 206. Preferably, the thickness of the PCB board 205 is such that a magnetic field generated by the magnet 231 submerges at least a portion of the metallic plate 206. The magnetic attraction between the magnet 231 and the metallic plate 206 will maintain the MEMS device 240 in a fixed position on the PCB board 205; a force which is greater than the magnetic force between the magnet 231 and metallic plate 206 will be required to move the MEMS device 240. Thus the MEMS device 240 cannot be easily displaced as the glue between the magnet 231 and PCB board 205 is drying.

Furthermore, due to the magnetic attraction between the magnet 231 of the MEMS device 204 and the metal plate, the MEMS device 240 will be less likely to fall or may become lost while being handled.

The above-mentioned steps are repeated if it is required to mount a plurality of MEMS devices 240 on the PCB board 205. Each of the apertures 216 of the grid 215 in the alignment mask 204 can be used to position each of the plurality of MEMS devices 240 on the PCB board 205 in the manner previously described.

Once the plurality of MEMS devices 240 have been mounted on the PCB board 205 the alignment mask is then removed from the stack 230 i.e. the alignment mask 204 is dismounted from the PCB board 205. The PCB board 205 is then divided to provide a plurality of mechanically independent MEMS micro mirror assemblies, each MEMS micro mirror assembly comprising a single MEMS device 240 mounted on a portion of the PCB board 205. The PCB board 204 could be divided using any suitable means, for example the PCB board 204 may be divided by cutting the PCB board using a cutting tool or simply could be segmented by hand if the PCB board is has lines of mechanical weaknesses.

When the PCB board is cut the mechanically independent MEMS micro mirror assemblies remain in a fixed position on the metallic plate 206 due to the magnetic attraction between the magnets 231 of the MEMS devices 240 and the metallic plate 206. This facilitates handling of the MEMS micro mirror assemblies and also reduces the risk of a MEMS micro mirror assembly becoming lost or displaced, for example because of attraction between magnets of different MEMS micro mirror assemblies to one another.

For each MEMS micro mirror, each of the MEMS devices 240 are then electrically connected to the portion of the PCB board 205 on which they are mounted. Electrical connection can be achieve a number of ways; for example, by arranging the PCB board such that electrical pads on the PCB board directly contact electrical pads on the MEMS device, or by arranging one or more wire bonds to electrically connect one or more electrical pads on the PCB board to one or more electrical pads on the MEMS device. Optionally, a protective material may be arranged to form an enclosure which encloses the one or more wire bonds.

Figure 5A:
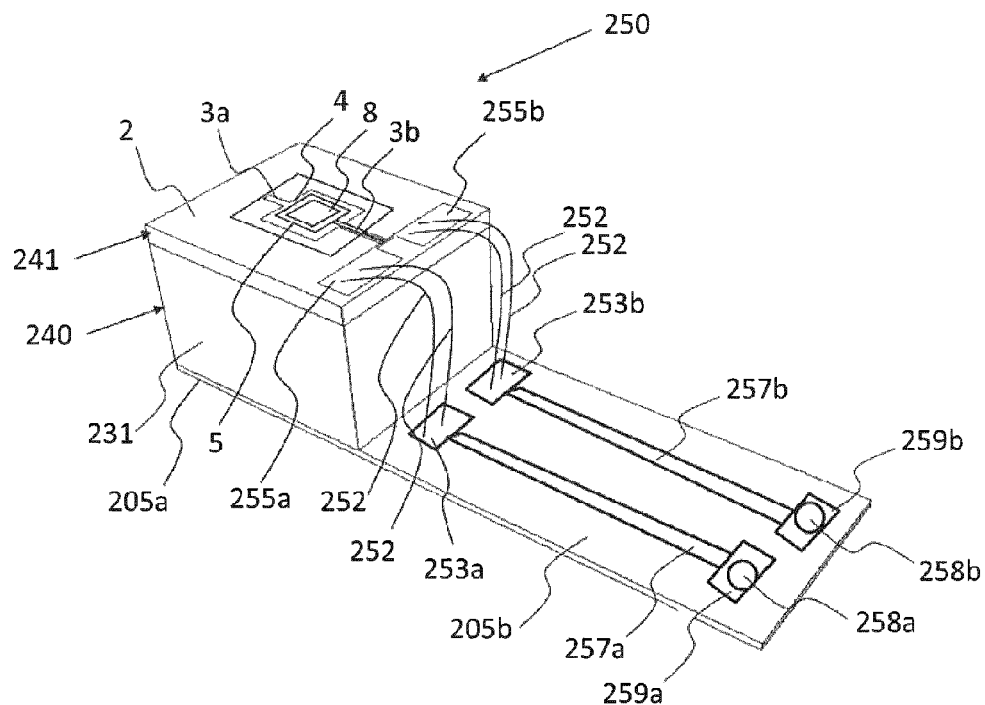
FIGS. 5a and b provide perspective views of an exemplary MEMS micro mirror assembly which is manufacture using the method of the present invention.

FIGS. 5a and b provide perspective views of a MEMS micro mirror assembly 250 according to an embodiment of the present invention.

A MEMS micro mirror assembly 250 comprises a MEMS device 240 mounted on the PCB board 205. The PCB board 205 comprises a portion 205b on which the MEMS device 240 is mounted and a first extension portion 205a which extends from beneath the MEMS device 240. Illustrated in FIG. 5a as a dashed-line the PCB board 205 may comprise a second extension portion 205c which extends from beneath the MEMS device 240 in a direction opposite to the first extension portion 205a.

The MEMS device 240 comprises a MEMS die 241 and a magnet 231. The MEMS die may comprise any of the features of the MEMS die mentioned in the introduction. In this example, the MEMS die comprises a first support frame 2, first and second torsional arms 3a,b, the moveable part 4, the MEMS micro mirror 8, and first actuation coil 5, define collectively a MEMS die 10

It will be understood that the PCB board 205 may be further mounted on a metallic plate 206.

The MEMS device 240 is electrically connected to the PCB board 205 by means of a plurality of wire bonds 252 which electrically connect two electrical pads 253a,b on the PCB board 205 to two electrical pads 255a,b on the MEMS device 240. In this example the two electrical pads 253a,b are provided on the first extension portion 205a of the PCB board 205; however it will be understood that the two electrical pads 253a,b could be provided on a second extension portion 205c of the PCB board 205. In this example two wire bonds 252 electrically connect each electrical pad 253a,b on the PCB board 205 to each electrical pad 255a,b on the MEMS device 240. It will be understood that any number of electrical pads may be provided on the PCB board 205 or MEMS device.

The PCB board 205 further comprises conductive lines 257 which are arranged to electrically connect the electrical pads 253a,b on the PCB board 205 to secondary electrical pads 259a,b which comprises vias 257a,b. The secondary electrical pads 259a,b are usable to connect the MEMS micro mirror assembly 250 to electrical contacts of another electrical component. For example, if the MEMS micro mirror assembly 250 is to be integrated into a projection device, the MEMS micro mirror assembly 250 may be electrically connected to the projection device by means of the secondary electrical pads 259a,b. Optionally, the secondary electrical pads 259a,b may be provided on a first extension portion 205a of the PCB board 205 and the two electrical pads 253a,b could be provided on a second extension portion 205c of the PCB board 205. The PCB board 205 may be flexed so that the secondary electrical pads 259a,b contact the appropriate electrical contacts in the projection device for integration.

Figure 5B:
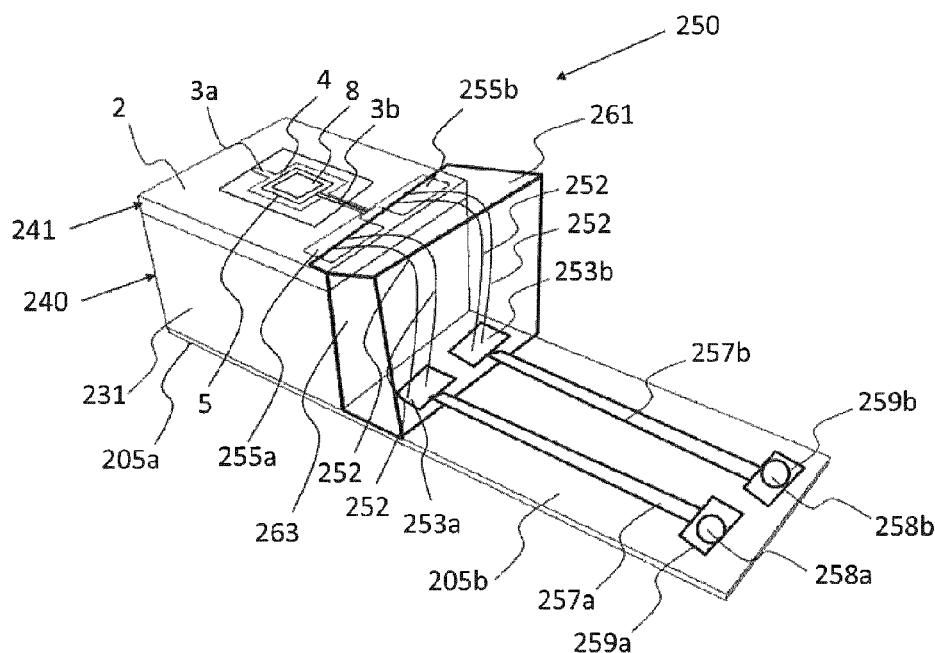
Figure 6A:
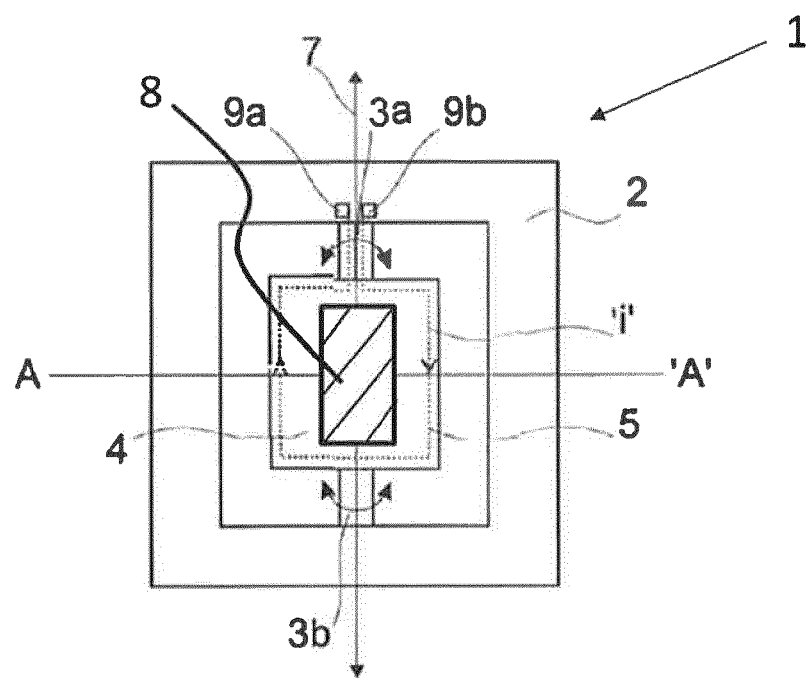
FIG. 6a provides a plan view of a known MEMS micromirror device.
Figure 6B:
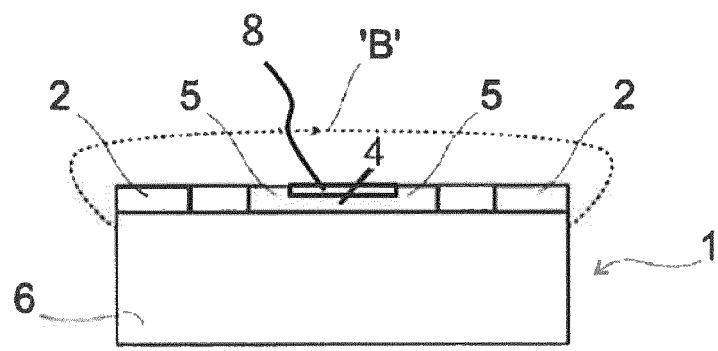
Figure 7:
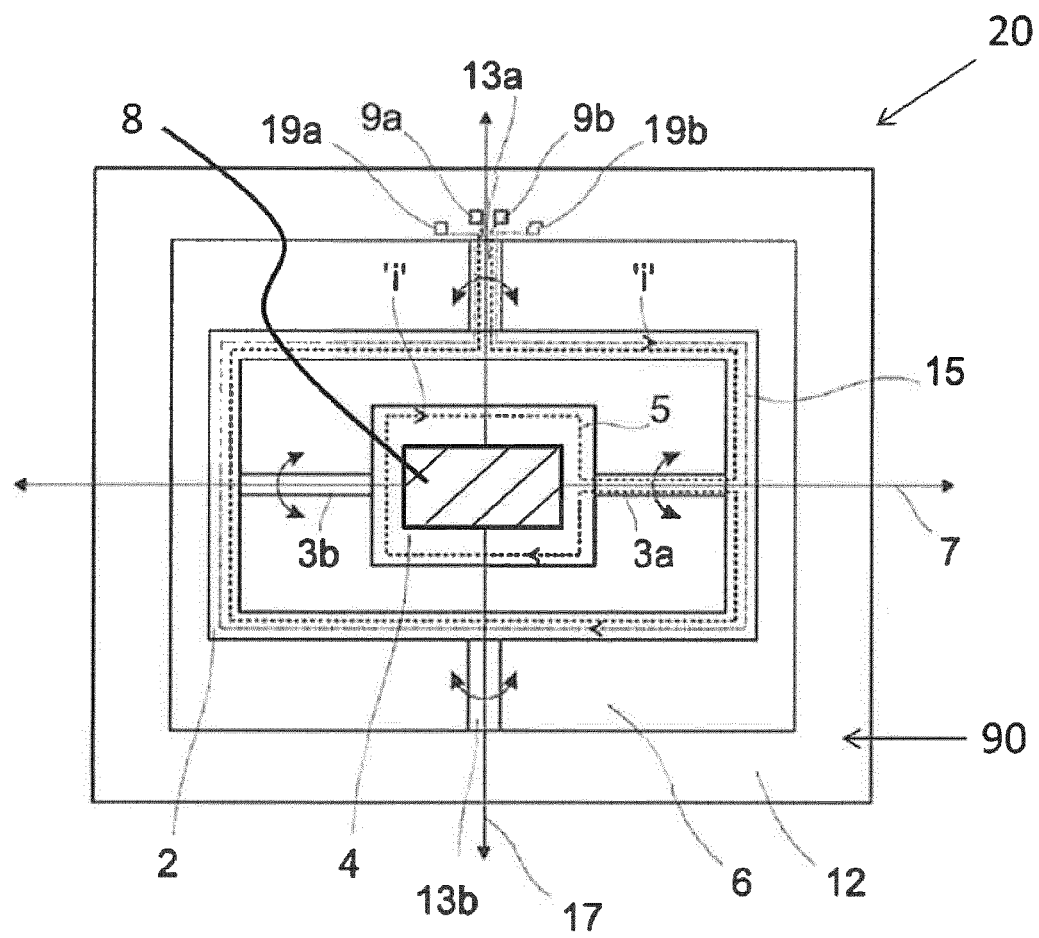
FIG. 7 provides a plan view of another known MEMS micro-mirror device.

As shown in FIG. 5b the MEMS micro mirror assembly 250 may optionally, further comprise a protective sheet 261 which is arranged to form an enclosure 263 which encloses the plurality of wire bonds 252. The protective sheet 261 protects the wire bonds 252 from mechanical tearing and or shearing and from dust and humidity.

It will be understood that in each of the embodiments each of the electrical pads 253a,b on the PCB board 205 and/or each of the electrical pads 255a,b on the MEMS device 240, could each be double sided. Preferably, the electrical pads 253a,b on the PCB board 205 are double sided, meaning that electrical contact to the electrical pads 253a,b can be achieved at opposing sides of the PCB board 205 e.g. at both an upper and lower surface of the PCB board 205.

Various modifications and variations to the described embodiments of the invention will be apparent to those skilled in the art without departing from the scope of the invention as defined in the appended claims. Although the invention has been described in connection with specific preferred embodiments, it should be understood that the invention as claimed should not be unduly limited to such specific embodiment.

The invention claimed is:

1. A method of manufacturing a MEMS micro mirror assembly, comprising the steps of:
   mounting a PCB board on a metallic plate;
   mounting a MEMS device on the PCB board, wherein the MEMS device comprises a MEMS die and a magnet;
   mounting an alignment mask on the PCB board, wherein the alignment mask comprises a grid;
   using the grid of the alignment mask to position one or more MEMS devices on the PCB board when mounting the one or more MEMS devices on the PCB board;
   wherein the step of using the grid of the alignment mask to position one or more MEMS devices on the PCB board comprises, positioning a single MEMS device in one or more apertures defined in the grid, and arranging the or each MEMS device so that at least a first and second side of the or each MEMS device contacts the grid.

2. A method according to claim 1, wherein the step of mounting the MEMS device on the PCB board, comprises the steps of first mounting the magnet of the MEMS device on the PCB board and then mounting the MEMS die on the magnet.

3. A method according to claim 1, wherein the step of mounting the MEMS device on the PCB board comprises fixing the MEMS device to the PCB board.

4. A method according to claim 1, comprising the step of mounting a plurality of MEMS devices on the PCB board.

5. A method according to claim 4 comprising the step of dividing the PCB board to provide a plurality of mechanically independent MEMS assemblies, each MEMS assembly comprising a single MEMS device mounted on a segment of the PCB board.

6. A method according to claim 1, wherein the method further comprises the step of securing the alignment mask to the PCB board before the one or more MEMS devices are mounted on the PCB board, and removing the alignment mask from the PCB board after the or each MEMS device has been mounted on the PCB board.

7. A method according to claim 1, wherein the method comprises the step of positioning a MEMS device such that a first and second side of a MEMS device abuts the grid of the alignment mask and an edge of the MEMS device, which is located at an interface between the first and second sides, is located in a cut-out, which is provided in the grid, so that the edge of the MEMS device remains remote from the grid when the first and second sides of the MEMS device contact the grid.

8. A method according to claim 1, further comprising the step of electrically connecting a MEMS device to the PCB board by arranging one or more wire bonds to electrically connect one or more electrical pads on the MEMS device to one or more electrical pads on the PCB board.

9. A method according to claim 1, comprising the step of arranging one or more wire bonds to electrically connect one or more electrical pads on the MEMS device to one or more electrical pads provide on a first extension portion on the PCB board which extends from beneath the MEMS device.

10. A method according to claim 8, wherein the PCB board comprises a first and second extension portions which each extend from beneath the MEMS device, comprising the step of arranging one or more wire bonds to electrically connect one or more electrical pads on the MEMS device to one or more electrical pads provide on the second extension portion of the PCB board.

11. A method according to claim 8 further comprising the step arranging a protective material to form an enclosure which encloses, the one or more wire bonds.

12. A method according to claim 1, comprising the step of fixing the MEMS device to the PCB board and dismounting a PCB board from the metallic plate after the MEMS device is fixed to the PCB board.

13. A MEMS micro minor assembly comprising:
   a MEMS device mounted on the PCB board, wherein the MEMS device comprises a MEMS die and a magnet, wherein the PCB board is further mounted on a metallic plate; an alignment mask which is mounted on the PCB board, wherein the alignment mask comprises a grid; and wherein the MEMS device is positioned in an aperture defined in the grid, and arranging so that at least a first and second side of the MEMS device contacts the grid.

* * * * *